(12) United States Patent
Cote et al.

(10) Patent No.: US 7,573,726 B1
(45) Date of Patent: Aug. 11, 2009

(54) LATCH ASSEMBLY

(75) Inventors: Gerald J. Cote, Upton, MA (US); Keith C. Johnson, Medway, MA (US); Albert F. Beinor, Jr., Sutton, MA (US); Ilhan C. Gundogan, Lexington, MA (US); W. Brian Cunningham, Westborough, MA (US); Joseph P. King, Sterling, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/963,947

(22) Filed: Dec. 24, 2007

(51) Int. Cl.
*H05K 7/12* (2006.01)

(52) U.S. Cl. .................. 361/798; 361/754; 361/747; 361/726; 361/732

(58) Field of Classification Search .......... 361/754, 361/798, 726, 732, 740, 747, 759, 801; 312/223.21
See application file for complete search history.

(56) References Cited

U.S. PATENT DOCUMENTS

| | | | | |
|---|---|---|---|---|
| 4,313,150 A | * | 1/1982 | Chu | 361/755 |
| 5,967,810 A | * | 10/1999 | Spickler et al. | 439/159 |
| 6,816,388 B2 | * | 11/2004 | Junkins et al. | 361/801 |
| 7,466,561 B2 | * | 12/2008 | Dean | 361/798 |

* cited by examiner

*Primary Examiner*—Dameon E Levi

(57) ABSTRACT

A printed circuit board module for a rack mounted chassis. The module includes a latching assembly having: a handle and a catch. When the module is inserted a predetermined distance into a chassis, the catch becomes inserted into an aperture formed on the chassis and when, at such predetermined distance, the handle is slid inwardly into the chassis, the catch engages the handle to retain the handle within the module. On the other hand if, when the module is inserted into the chassis at a distance less than the predetermined distance, the catch is unable to be inserted into an aperture and when the handle is slid inwardly from the chassis, the catch prevents the handle from being retained and such handle, when released, is urged outwardly of the module thereby indicating that the module is improperly inserted within the chassis.

10 Claims, 9 Drawing Sheets

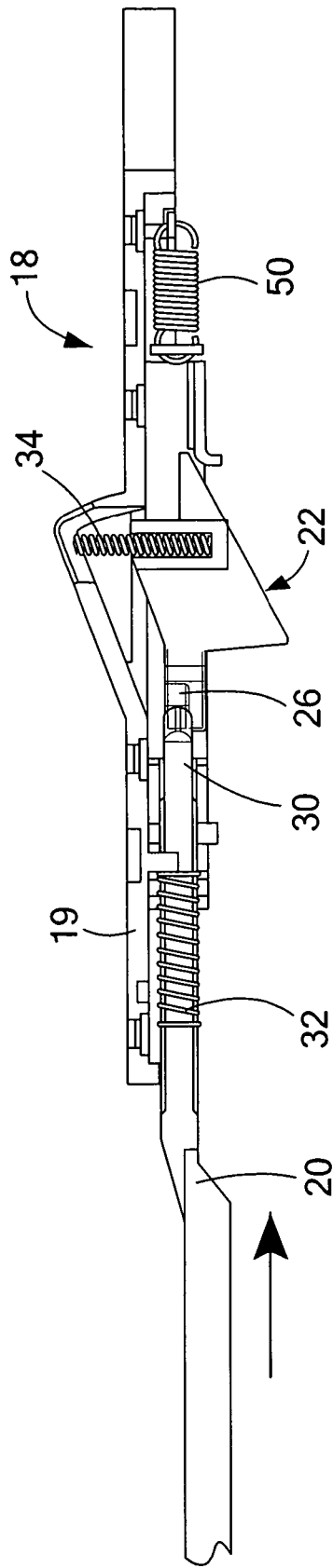
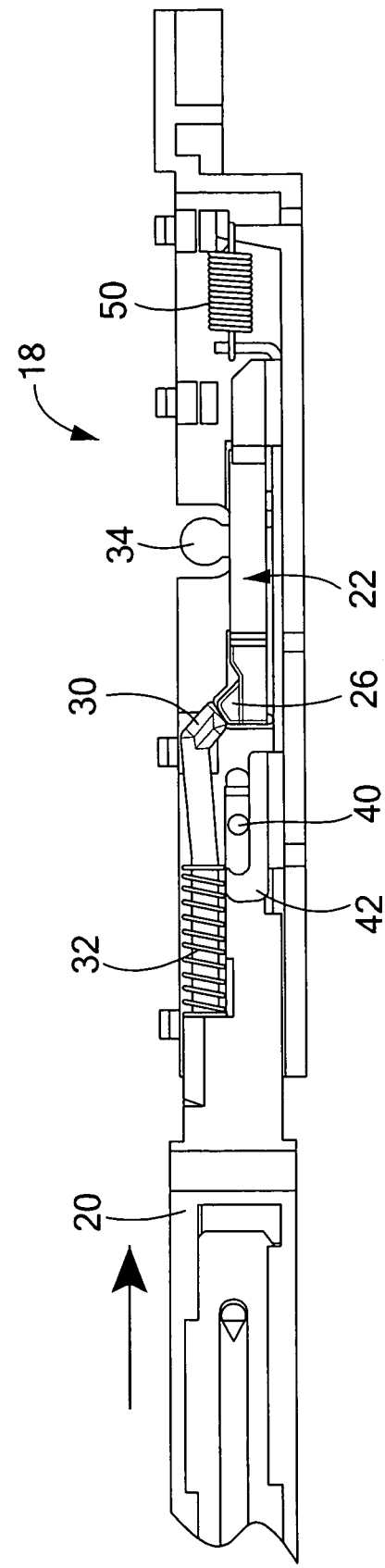
FIG. 6A
FIG. 6B

LATCH ASSEMBLY

TECHNICAL FIELD

This invention relates generally to latch assemblies and more particularly to latch assemblies for latching a housing into a chassis while indicting whether such housing has been fully inserted into the chassis.

BACKGROUND

As is known in the art, it is frequently desired to latch a housing into a chassis. One application is when the housing is a printed circuit board (PCB) module having an outer frame used to hold a printed circuit board in a rack mounted chassis, for example. In such application the module with the printed circuit board is inserted into the chassis. At the back of the chassis is a connector for engaging a rear-mounted connector of the printed circuit board. When the module is inserted into the front opening of the chassis it is necessary that the user be assured that the rear mounted PCB connector is fully engaged with the chassis connector of the PCB. It is also necessary to latch the fully engaged PCB module within the chassis until such time that the module is to be removed from the chassis.

SUMMARY

In accordance with the invention, a housing is provided having a latch assembly. The latching assembly includes a handle and a catch. When the housing is inserted a predetermined distance into a chassis, the catch becomes inserted into an aperture formed on the chassis and when, at such predetermined distance, the handle is slid inwardly into the chassis, the catch engages the handle to retain the handle within the housing. On the other hand if, when the housing is inserted into the chassis at a distance less than the predetermined distance, the catch is unable to be inserted into an aperture and when the handle is slid inwardly from the chassis, the catch prevents the handle from being retained and such handle, when released, is urged outwardly of the module thereby indicating that the housing is improperly inserted within chassis.

In one embodiment, the housing is a printed circuit board module for a rack-mounted chassis is provided. The module includes a latching assembly having: a handle and a catch. When the module is inserted a predetermined distance into a chassis, the catch becomes inserted into an aperture formed on the chassis and when, at such predetermined distance, the handle is slid inwardly onto the chassis, the catch engages the handle to retain the handle within the module. On the other hand if, when the module is inserted into the chassis at a distance less than the predetermined distance, the catch is unable to be inserted into an aperture and when the handle is slid inwardly into the chassis, the catch prevents the handle from being retained and such handle, when released, is urged outwardly of the module thereby indicating that the module is improperly inserted within the chassis.

In one embodiment, a printed circuit board module for a rack-mounted chassis is provided. The module includes: a frame having fixed therein a printed circuit board, for insertion into and for removal from the chassis as such frame is moved in an inward direction toward the chassis or an outward direction away from the chassis, respectively, and a latching assembly. The latching assembly includes: a handle, slidably mounted to the frame along the inward direction or the outward direction; and a catch. When the frame is inserted a predetermined distance into the chassis, the catch becomes inserted into an aperture formed on the chassis and when, at such predetermined distance, the handle is slid inwardly into the frame, the catch engages the handle to retain the handle within the frame. On the other hand if, when the frame is inserted into the chassis at a distance less than the predetermined distance, the catch is unable to be inserted into an aperture formed on the chassis and when the handle is slid inwardly into the frame, the catch prevents the handle from being retained within the frame and such handle, when released, is urged outwardly of the frame thereby indicating that the frame is improperly inserted within the chassis.

In one embodiment, a printed circuit board module for a rack mounted chassis is provided. The module includes a frame having fixed therein a printed circuit board, for insertion into and for removal from the chassis as such frame is moved in an inward direction toward the chassis or an outward direction away from the chassis, respectively. The module also includes a latching assembly. The latching assembly comprises: a housing affixed to a sidewall of the frame; and a handle, slidably mounted to the housing along the inward direction or the outward direction. A distal portion of the handle extends outwardly of a frontal portion of the housing and a frontal portion of the frame. A proximal end of the handle is disposed within the housing and has an engaging section thereon. A catch is pivotally mounted to the handle. The catch pivots outwardly or inwardly of the handle in a plane orthogonal to the outwardly or inwardly direction of motion of the handle. When the frame is inserted a predetermined distance into the chassis, the catch is pivoted outwardly with an outer edge of the catch becoming inserted into an aperture formed on the chassis and when, at such predetermined distance, the handle is slid inwardly into the frame, an inner edge of the catch engages the engaging section of the handle to retain the handle within the frame. On the other hand, if, when the frame is inserted into the chassis at a distance less than the predetermined distance, the catch remains pivoted inwardly with the outer edge of the catch becoming unable to be inserted into an aperture formed on the chassis and when the handle is slid inwardly onto the frame, the inner edge of the catch is positioned to prevent such catch from engaging the engaging section of the handle and thereby preventing the handle from being retained within the frame and such handle, when released, is urged outwardly of the frame thereby indicating that the frame is improperly inserted within the chassis.

In accordance with the invention, a method is provided for determining whether a printed circuit board module for a rack mounted chassis is properly inserted into the chassis. The method includes: sliding a handle slidably mounted to the module inwardly after the module has been inserted into the rack; and detecting whether the handle has become latched within the module or remains extended outwardly from the module. When the module is inserted into the chassis, when the handle is slid inwardly onto the nodule, the handle is retained within the module when the module is properly inserted into the chassis, whereas if, when the module is improperly inserted into the chassis, when the handle is slid inwardly into the module and then released by the inserter, the handle is urged outwardly of the module thereby indicating that the module is improperly inserted within chassis.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 6A is a side elevation view of the latch assembly of the module of FIG. 1A according to the invention, such module being shown with a handle of such assembly being inserted within the assembly prior to such module being in the latched condition;

FIG. 6B is a top elevation view of the latch assembly of the module of FIG. 1A according to the invention, such module being shown with a handle of such assembly being inserted within the assembly prior to such module being in the latched condition;

Like reference symbols in the various drawings indicate like elements.

DETAILED DESCRIPTION

Figure 1:
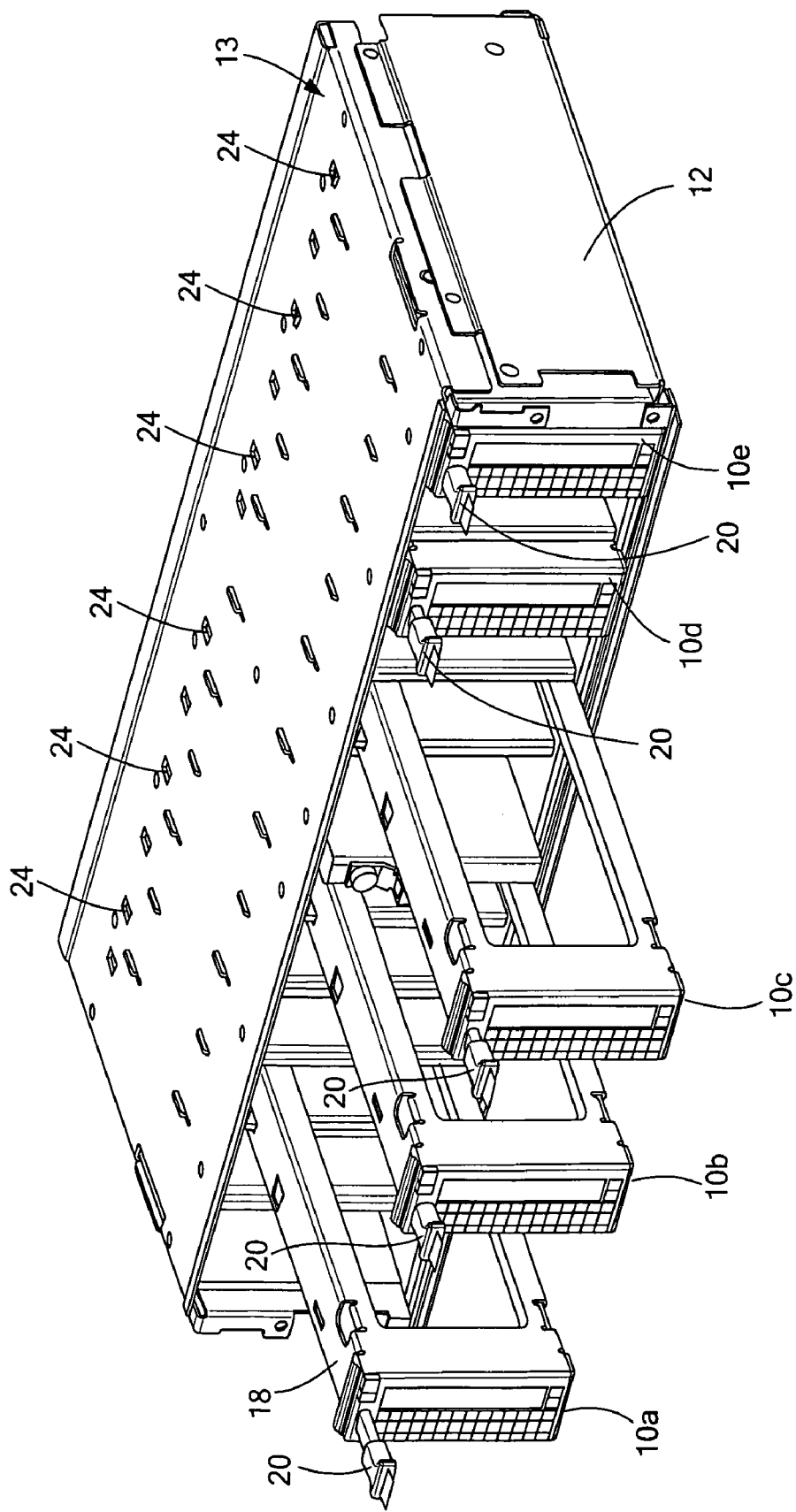
FIG. 1 is a perspective view of a plurality of PCB modules in various positions relative to a rack-mounted chassis for such modules according to the invention.
Figure 1A:
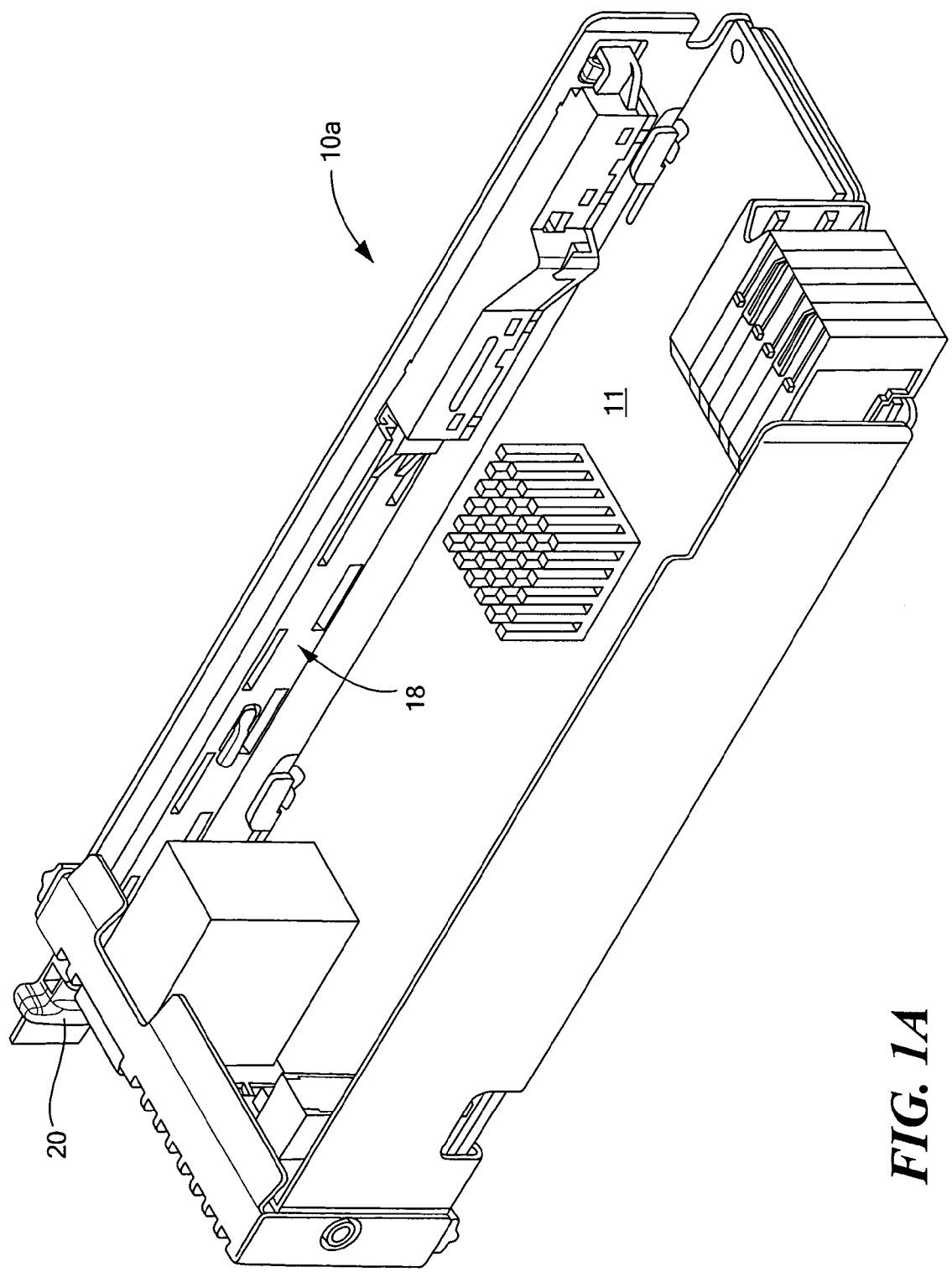
FIG. 1A is a perspective view of an exemplary one of the modules.

Referring now to FIG. 1, a plurality of, here for example five, printed circuit board (PCB) modules 10a-10d are shown at various positions of insertion or removal from a rack mounted chassis 12. Each one of the PCB modules 10a-10e is identical in construction, an exemplary one thereof, here module 10a being shown in FIG. 1A with the PCB 11 therein, it being noted that in FIG. 1 the PCBs have been removed.

Considering an exemplary one of the modules 10a-10e, such module 10a includes a latching assembly 18 (FIG. 2) having: a support 19 that provides the upper wall of the module 10a; a handle 20, slidably mounted to the support 19 and thus slidable mounted within the module 10a; and catch 22 pivotally mounted to the support 19 and thus pivotally mounted to the module 10a. When the module 10a, for example, is inserted a predetermined distance into a chassis 12, the catch 22 becomes inserted into an aperture 24 formed in the upper surface of the chassis 12 and when, at such predetermined distance, (corresponding to the position in the chassis 12 when rear mounted connector of the module 10a is properly (fully) engaged with a connector, not shown, at the rear of the chassis 12), the handle 20 is slid inwardly along the support 19, and the rear portion 26 of the catch 22 engages a protrusion 30 on the handle 20 to retain the handle 20 within the support 19, whereas if, when the module 10 is inserted into the chassis 12 at a distance less than the predetermined distance, the catch 22 is unable to be inserted into an aperture 24 and when the handle 20 is slid inwardly along the support 19, the rear portion 26 of the catch 22 will not be in a position to engage the protrusion 30 on the handle 20 and thus the handle 20 will not be retained within the module 10 so that such handle 20, when released, will be urged outwardly of the module 10 thereby indicating that the module 10 is improperly inserted within chassis 12.

Figure 2:
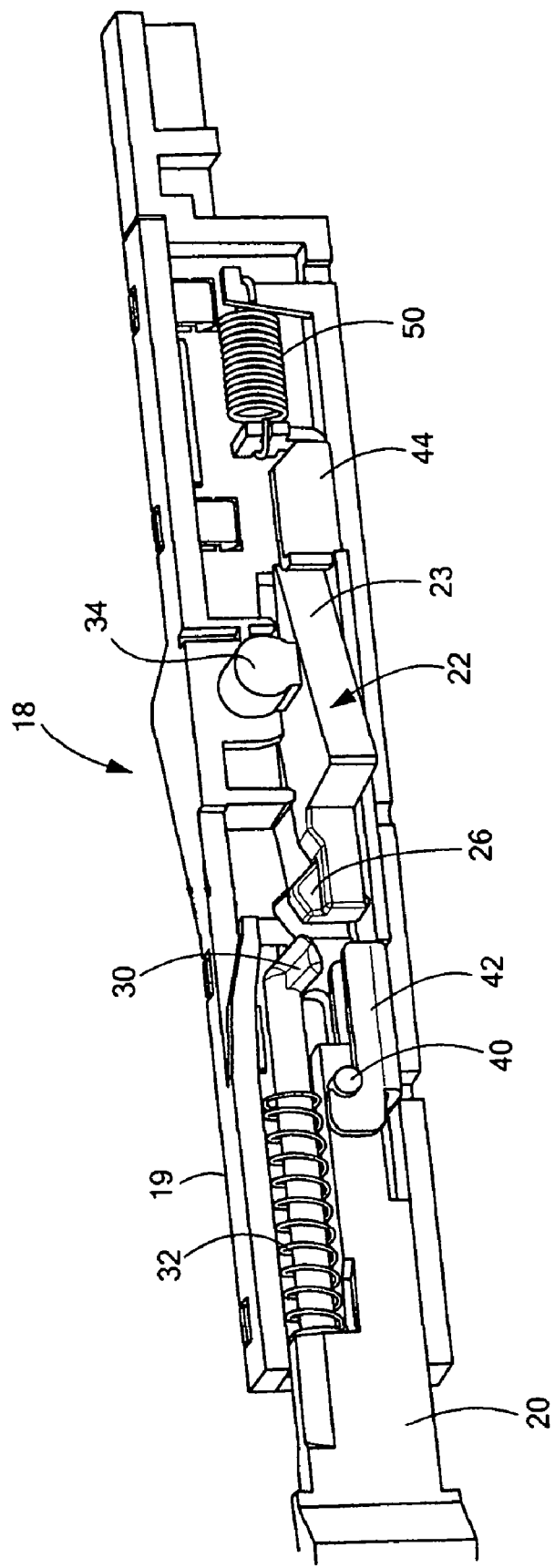
FIG. 2 is a side perspective view of a latch assembly of the module of FIG. 1A according to the invention, such module being shown in the unlatched condition.
Figure 5A:
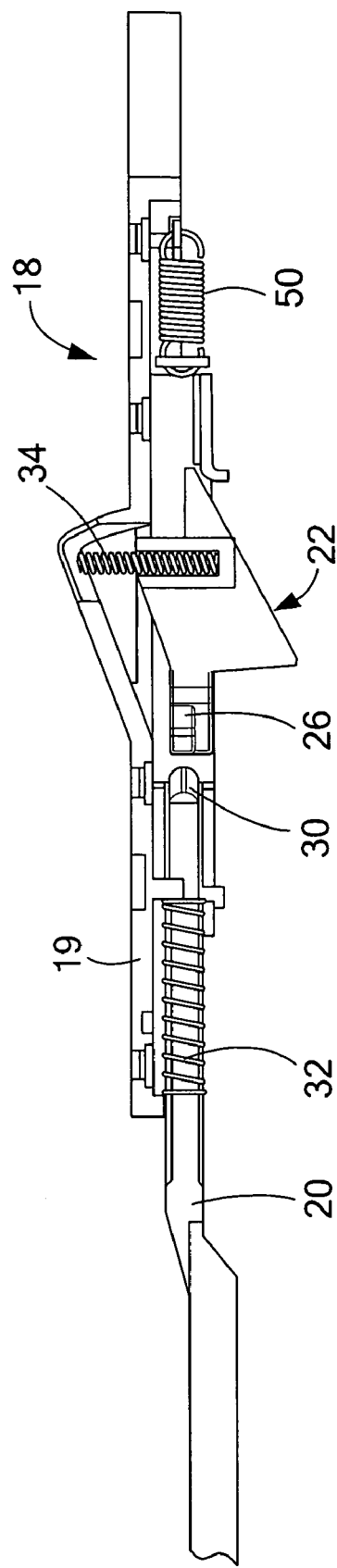
FIG. 5A is a side elevation view of the latch assembly of the module of FIG. 1A according to the invention, such module being shown in the unlatched condition.
Figure 5B:
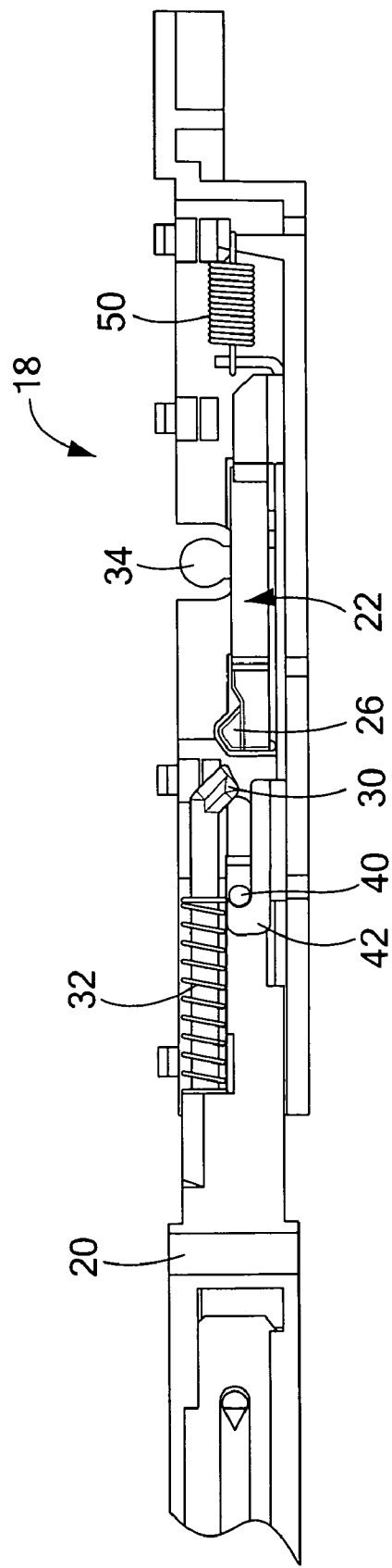
FIG. 5B is a top elevation view of the latch assembly of the module of FIG. 1A according to the invention, such module being shown in the unlatched condition.
Figure 7A:
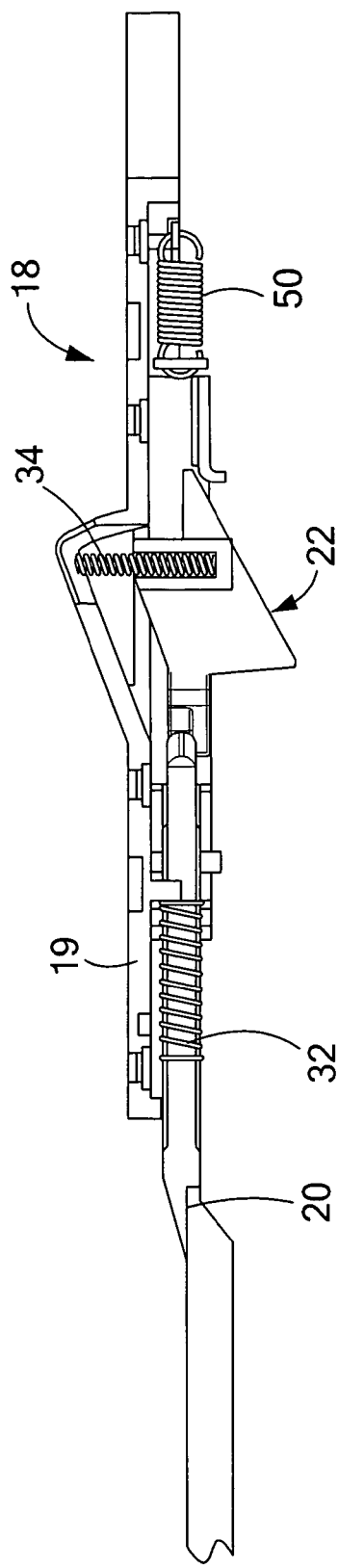
FIG. 7A is a side elevation view of the latch assembly of the module of FIG. 1A according to the invention, such module being shown in the latched condition.
Figure 7B:
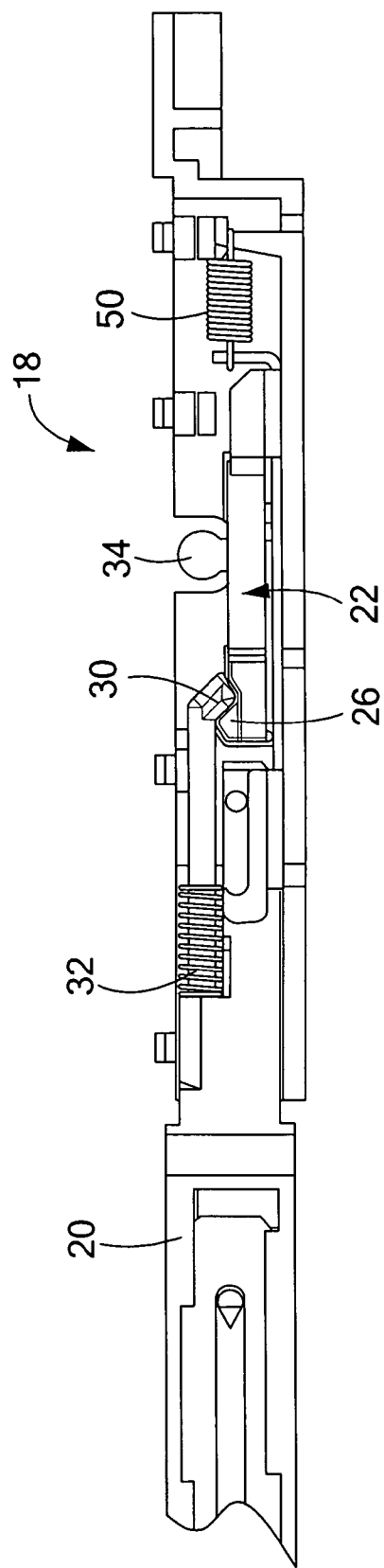
FIG. 7B is a top elevation view of the latch assembly of the module of FIG. 1A according to the invention, such module being shown in the latched condition.

More particularly, FIGS. 2, 5A and 5B show the assembly 18 in the unlatched condition. This condition may be when a module is positioned outside of the chassis as shown for module 10a in FIG. 1 or when the module is inserted a predetermined distance into a chassis 12 and the catch 22 becomes inserted into an aperture 24 formed in the upper surface of the chassis 12. It is noted that the handle 20 is urged outwardly of the assembly 18 (and hence outwardly of the module 10a (see module 10a in FIG. 1)) because on a decompressed (i.e., expanded) spring 32. It is also noted that the catch 22 is urged outwardly of the assembly 18 (and hence outwardly of the module 10a because on a compressed spring 34. it being noted that the actual spring 34 is shown in FIGS. 5B, 6B and 7B within a housing.

First, the installer inserts (slides) the module 10a into the chaises 12. As the front portion 23 (FIG. 2) of catch 22 engages the upper surface 13 of the chassis (FIG. 1), the rearward motion of the installer module insertion causes the catch forward portion 23 (FIG. 2) to pivot inward of the assembly 18 and the rear portion 26 also swings inward of the assembly as shown in FIG. 3B it being is noted that spring 34 becomes compressed. In such condition, when the handle 20 is slid by the installer inwardly along the support 19 FIG. 3B, the protrusion 30 on the rear post-like structure of the handle 20 will not be in alignment with the rear portion 26 of catch 22. Thus, when the installer slides the handles 20 inward and then releases the handle 20, spring 32 will force the released handle 20 outward and the handle 20 will not be retained within the assembly 18, as shown in FIG. 1 for module 10d thereby indicating to the installer that the module 10 is improperly inserted within chassis 12.

Consider now the case when the module is inserted a predetermined distance into a chassis 12 and the catch 22 becomes inserted into an aperture 24 formed in the upper surface 13 of the chassis 12. In such condition, spring 34 becomes expanded and pivots catch 20 outward of the handle 20. Now, when the handle 20 is slid by the installer inwardly along the support 19 as shown by the arrows in FIGS. 6A and 6B, the protrusion 30 on the rear post-like structure of the handle 20, slides over the rear (camming surface) portion 26 of repositioned, now outward pivoted catch 22. As the installer continues to slide the handle 20 rearward, the rear portion 26 of the catch 22 will be in a position to engage the protrusion 30 on the handle 20 (FIGS. 3A, 7A and 7B) and thus the handle 20 will be retained within the module 10. Thus, when the installer releases his/her grip on the handle 20, the handle 20 will remain within the module as shown for module 10e in FIG. 1.

Figure 3A:
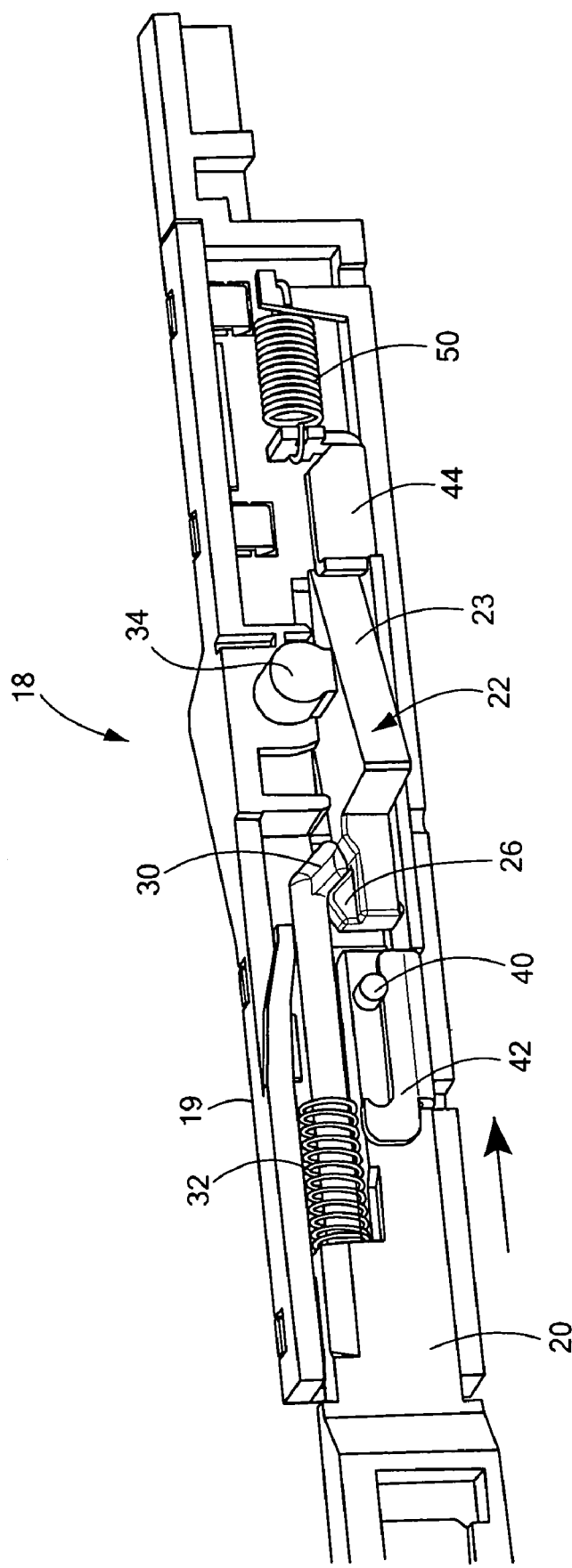
FIG. 3A is a side perspective view of the latch assembly of the module of FIG. 1A according to the invention, such module being shown in the latched condition.
Figure 3B:
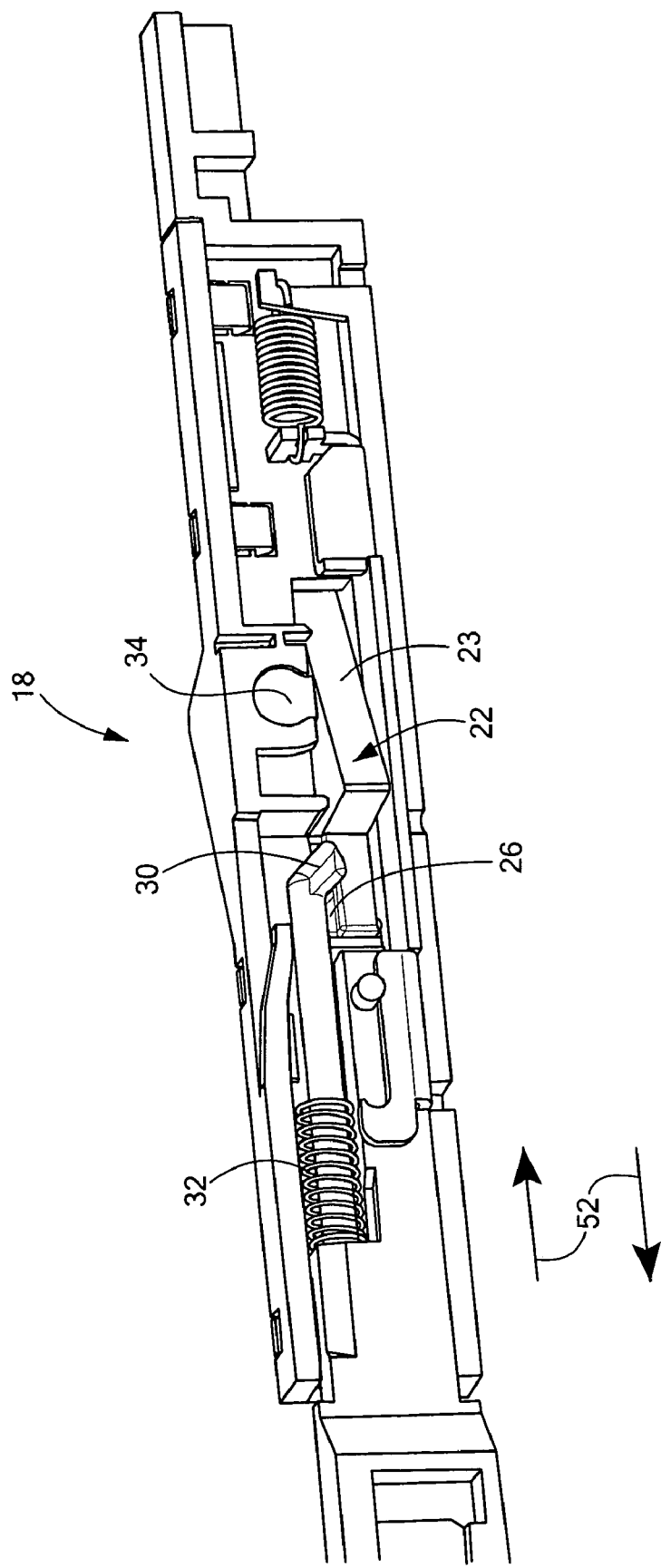
FIG. 3B is a side perspective view of the latch assembly of the module of FIG. 1A according to the invention, such module being shown in an improper (i.e., not fully inserted position) within the chassis

Thus, FIG. 3A shows the assembly 18 in the latched condition; i.e., as shown in FIG. 1 for module 10e (FIG. 1) when the module is inserted a predetermined distance into a chassis 12. Here, as shown in FIG. 3A, the catch 22 becomes inserted into an aperture 24 (FIG. 1) formed in the upper surface 13 of the chassis 12 and when, at such predetermined distance, (corresponding to the position in the chassis 12 when rear mounted connector of the module 10e is properly (fully) engaged with a connector, not shown, at the rear of the chassis 12). For the installer of the module to make sure that the module is in the proper position, the installer slides the handle 20 towards the rear of the chassis 12 (FIG. 1). Thus referring to FIG. 3A, the installer slides the handle 20 inwardly along the support 19 as indicated by the arrow in FIG. 3A), and the rear portion 26 (FIG. 3A) and, with the catch 22 urged outwardly of the assembly 18, the rear portion 26 of catch 22 which is also pivoted outwardly of the assembly 18, engages the outward protrusion 30 on the handle 20 to retain the handle 20 (see module 10e in FIG. 1) within the support 19; that is rear portion 26 of the catch 22 pivots inwardly of the assembly 18 to a position where the rear portion 26 of the catch 22 is in a position to engage the protrusion 30 on the handle 20 and thus the handle 20 is retained within the assembly 18 and hence is retained within the module 10e, as shown in FIG. 1.

On the other hand, if the module 10d, (FIG. 1) is not properly inserted into the chassis 12, when the installer slides the handle 22 towards the rear of the chassis 12 as shown by arrow 50 in FIG. 3B, the assembly will remain in the unlatched position as shown in FIG. 2, because the catch 22 had not been pivoted inward by engagement with the upper surface of the chassis and therefore the handle 20 will not be retained because on a decompressed (i.e., expanded) spring 32, FIG. 3B by rather with move outward in the direction of arrow 52 because of the compressive action of spring 32 thereby indicating to the installer that, because of the outward protrusion of the handle, the module has not been properly inserted into the chassis. Thus, FIG. 2 shows the condition of the assembly 18 when the module 10a, 10b, 10c and 10d are in the position shown in FIG. 1. Note that the handle 20 in FIG. 1 protrudes outwardly, here to the left, of the module 10a, as indicated by the arrow in FIG. 2.

Figure 4:
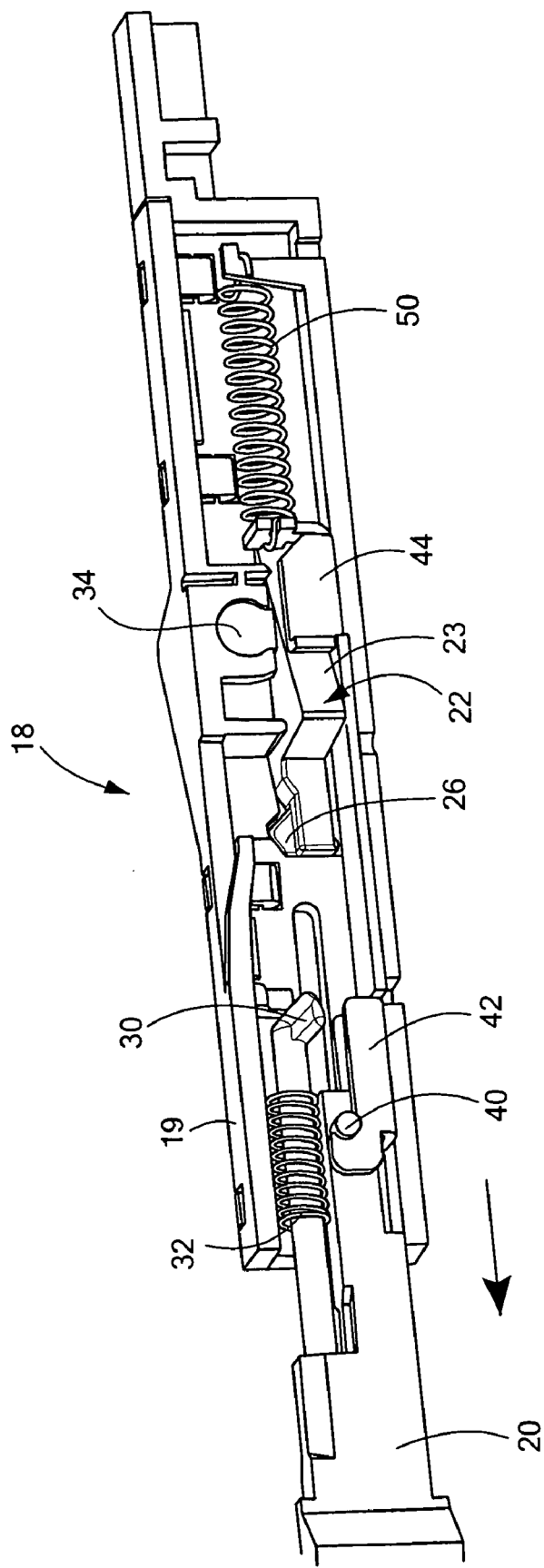
FIG. 4 is a side perspective view of the latch assembly of the module of FIG. 1A according to the invention, such module being shown in the eject condition.

Referring now to FIG. 4, once the handle 20 has been unlatched as shown in FIG. 4, in order to remove the module, the installer slides or pulls the handle 20 outward in the direction shown by the arrow in FIG. 4. A post 40 affixed to the handle then engages a hook like member 42 sliding the hook like member 42 along with the post 40. It is first noted that the hook line member 42 is connected to a release tab 44. It is noted that the hook line member 42 is slidably mounted to the support 19 and hence slidably mounted to assembly 18. It is further noted that in both the unlatched and latched positions (FIGS. 2 and 3) the release tab 44, and hence the hook like member 42 connected to it, are urged rearward by compressed spring 50. Thus, as the installer slides or pulls the handle 20 outward in the direction shown by the arrow in FIG. 4, the post 40 affixed to the handle engages the hook like member 42 sliding the hook like member 42 along with the release tab 44. The release tab 44 is thus forced rearward thereby urging the tab 44 to slide over and thereby force the catch 22 inward of the assembly 18 so that the catch 22 can be recessed within the assembly and allow such catch to pass into the aperture 25 (FIG. 1) in the upper surface 13 of the chassis 12. Thus, the catch 22 is now disengaged from (recessed under) the aperture 25 and the installer can remove the module 10 from the chassis 12.

A number of embodiments of the invention have been described. Nevertheless, it will be understood that various modifications may be made without departing from the spirit and scope of the invention. Accordingly, other embodiments are within the scope of the following claims.

What is claimed is:

1. A printed circuit board module for a rack mounted chassis, comprising:
   a latching assembly having:
      a handle;
      a catch;
      and wherein when the module is inserted a predetermined distance into the chassis, the catch becomes inserted into an aperture formed in the chassis and when, at such predetermined distance, the handle is slid inwardly into the chassis, the catch engages the handle to retain the handle within the module, whereas if, when the module is inserted into the chassis at a distance less than the predetermined distance, the catch is unable to be inserted into an aperture and when the handle is slid inwardly from the chassis, the catch prevents the handle from being retained and such handle, when released, is urged outwardly of the module thereby indicating that the module is improperly inserted within the chassis.

2. A printed circuit board module for a rack mounted chassis, comprising:
   a frame having fixed therein a printed circuit board, for insertion into and for removal from the chassis as such frame is moved in an inward direction toward the chassis or an outward direction away from the chassis, respectively;
   a latching assembly, comprising:
      a handle, slidably mounted to the frame along the inward direction or the outward direction;
      a catch, and
      wherein when the frame is inserted a predetermined distance into the chassis, the catch becomes inserted into an aperture formed in the chassis and when, at such predetermined distance, the handle is slid inwardly onto the frame, the catch engages the handle to retain the handle within the frame whereas, if, when the frame is inserted into the chassis at a distance less than the predetermined distance, the catch is unable to be inserted into an aperture formed on the chassis and when the handle is slid inwardly into the frame, the catch prevents the handle from being retained within the frame and such handle, when released, is urged outwardly of the frame thereby indicating that the frame is improperly inserted within the chassis.

3. A printed circuit board module for a rack mounted chassis, comprising:
   a frame having fixed therein a printed circuit board, for insertion into and for removal from the chassis as such frame is moved in an inward direction toward the chassis or an outward direction away from the chassis, respectively;
   a latching assembly, comprising:
      a housing affixed to a sidewall of the frame;
      a handle, slidably mounted to the housing along the inward direction or the outward direction, a distal portion of the handle extending outwardly of a frontal portion of the housing and a frontal portion of the frame, a proximal end of the handle being disposed within the housing and having an engaging section thereon;
      a catch pivotally mounted to the handle in a plane orthogonal to the outwardly or inwardly direction of motion of the handle, and
      wherein when the frame is inserted a predetermined distance into the chassis, the catch is pivoted outwardly with an outer edge of the catch becoming inserted into an aperture formed in the chassis and when, at such predetermined distance, the handle is slid inwardly onto the frame, an inner edge of the catch engages the engaging section of the handle to retain the handle within the frame whereas, if, when the frame is inserted into the chassis at a distance less than the predetermined distance, the catch remains pivoted inwardly with the outer edge of the catch becoming unable to be inserted into an aperture formed on the chassis and when the handle is slid inwardly onto the frame, the inner edge of the catch is positioned to prevent such catch from engaging the engaging section of the handle and thereby preventing the handle from being retained within the frame and such handle, when released, is urged outwardly of the frame thereby indicating that the frame is improperly inserted within the chassis.

4. A method for determining whether a printed circuit board module for a rack mounted chassis is properly inserted into the chassis, comprising:
- a sliding handle slidably mounted to the module inwardly after the module has been inserted into the rack; and
- detecting whether the handle has become latched within the module or remains extended outwardly from the module,
- wherein when the module is inserted into the chassis, when the handle is slid inwardly into the module, the handle is retained within the module when the module is properly inserted into the chassis, whereas if, when the module is improperly inserted into the chassis, when the handle is slid inwardly into the module and then released by the inserter, the handle is urged outwardly of the module thereby indicating that the module is improperly inserted within the chassis.

5. A printed circuit board module for a rack mounted chassis, comprising:
- a latching assembly having:
  - a handle;
  - a catch;
  - a first spring for engaging the latch;
  - a second spring;
  - and wherein when the module is inserted a predetermined distance into a chassis, the catch becomes forced inserted into an aperture formed on the chassis by the first spring and when, at such predetermined distance, the handle is slid inwardly into the chassis, the catch engages the handle to retain the handle within the module, whereas if, when the module is inserted into the chassis at a distance less than the predetermined distance, the catch is unable to be inserted into an aperture and when the handle is slid inwardly from the chassis, the catch prevents the handle from being retained and such handle, when released, is urged outwardly of the module by the second spring thereby indicating that the module is improperly inserted within the chassis.

6. The printed circuit board module recited in claim 2 including a first spring and a second spring and wherein the first spring engages the latch and wherein the second spring provides the handle, when released, with the outwardly urging indicating that the frame is improperly inserted within the chassis.

7. The printed circuit board module recited in claim 3 including a first spring and a second spring and wherein the first spring engages the latch and wherein the second spring provides the handle, when released, with the outwardly urging indicating that the frame is improperly inserted within the chassis.

8. The printed circuit board module recited in claim 5 wherein the first and second springs are disposed along orthogonal axes.

9. The printed circuit board module recited in claim 6 wherein the first and second springs are disposed along orthogonal axes.

10. The printed circuit board module recited in claim 7 wherein the first and second springs are disposed along orthogonal axes.

* * * * *